United States Patent
Kim et al.

(10) Patent No.: US 9,343,030 B2
(45) Date of Patent: May 17, 2016

(54) GATE DRIVING CIRCUIT AND DISPLAY APPARATUS INCLUDING THE SAME

(75) Inventors: Hyuk-Jin Kim, Asan-si (KR); Kyung-ho Park, Cheonan-si (KR); Sang Yong No, Asan-si (KR); YoungJe Cho, Cheonan-si (KR); Kook Hyun Choi, Seoul (KR); Yongjo Kim, Asan-si (KR); Sung Hoon Kim, Seoul (KR); Hyo-Seop Kim, Cheonan-si (KR)

(73) Assignee: SAMSUNG DISPLAY CO., LTD. (KR)

( * ) Notice: Subject to any disclaimer, the term of this patent is extended or adjusted under 35 U.S.C. 154(b) by 635 days.

(21) Appl. No.: 12/840,642

(22) Filed: Jul. 21, 2010

(65) Prior Publication Data

US 2011/0157263 A1    Jun. 30, 2011

(30) Foreign Application Priority Data

Dec. 29, 2009    (KR) .................. 10-2009-0133158

(51) Int. Cl.
| | | |
|---|---|---|
| G09G 5/02 | (2006.01) | |
| H03K 3/00 | (2006.01) | |
| G09G 3/36 | (2006.01) | |
| G11C 19/28 | (2006.01) | |

(52) U.S. Cl.
CPC .............. *G09G 3/3677* (2013.01); *G11C 19/28* (2013.01); *G09G 2300/0417* (2013.01); *G09G 2310/0286* (2013.01)

(58) Field of Classification Search
CPC ........................ G09G 3/3674; G09G 3/3677
USPC .................. 345/87, 98–100, 204; 377/64–81; 340/12.21
See application file for complete search history.

(56) References Cited

U.S. PATENT DOCUMENTS

| | | | | |
|---|---|---|---|---|
| 7,057,655 | B1 * | 6/2006 | Masuyama | 348/302 |
| 2003/0227433 | A1 * | 12/2003 | Moon | 345/100 |
| 2006/0007085 | A1 * | 1/2006 | Kim | G11C 19/28 345/87 |
| 2006/0221043 | A1 * | 10/2006 | Horibata et al. | 345/100 |
| 2006/0267911 | A1 * | 11/2006 | Jang | G11C 19/28 345/100 |
| 2007/0040792 | A1 * | 2/2007 | Kwag | G09G 3/2092 345/100 |
| 2007/0085811 | A1 * | 4/2007 | Lee | 345/100 |
| 2007/0248204 | A1 * | 10/2007 | Tobita | 377/64 |
| 2007/0296662 | A1 * | 12/2007 | Lee et al. | 345/87 |
| 2008/0012819 | A1 * | 1/2008 | Lee et al. | 345/100 |
| 2008/0211760 | A1 * | 9/2008 | Baek et al. | 345/98 |
| 2008/0218502 | A1 * | 9/2008 | Lee et al. | 345/208 |
| 2008/0224985 | A1 * | 9/2008 | Jang | G11C 19/00 345/100 |
| 2008/0266477 | A1 * | 10/2008 | Lee et al. | 349/46 |

(Continued)

FOREIGN PATENT DOCUMENTS

| | | |
|---|---|---|
| CN | 1716355 A | 1/2006 |
| CN | 101261412 A | 9/2008 |

(Continued)

*Primary Examiner* — Seokyun Moon
*Assistant Examiner* — Josemarie G Acha, III
(74) *Attorney, Agent, or Firm* — Cantor Colburn LLP

(57) ABSTRACT

A gate driving circuit includes N stages (where N is a natural number greater than or equal to 2). The N stages are cascaded, and each of the N stages has a gate line connected thereto. A first stage group includes k stages of the N stages (where k is a natural number less than N), and the first stage group outputs a first output signal in response to a start signal. A second stage group (including N–k stages) generates a second output signal in response to the first output signal and outputs the second output signal to a corresponding gate line. The first stage group includes a first buffer and a second buffer, each of which receives the start signal. A size of the first buffer is smaller than a size of the second buffer.

30 Claims, 13 Drawing Sheets

(56) References Cited

U.S. PATENT DOCUMENTS

| | | | |
|---|---|---|---|
| 2009/0122034 A1* | 5/2009 | Shin | G09G 3/3677 345/204 |
| 2009/0128476 A1* | 5/2009 | Lee | G09G 3/3677 345/98 |
| 2010/0156779 A1* | 6/2010 | Park et al. | 345/107 |

FOREIGN PATENT DOCUMENTS

| | | |
|---|---|---|
| CN | 101562046 A | 10/2009 |
| JP | 04116588 A | 4/1992 |
| JP | 2003-141893 A | 5/2003 |
| JP | 2006011286 A | 1/2006 |
| JP | 2006331633 A | 12/2006 |
| JP | 2008146079 A | 6/2008 |
| JP | 2008225476 A | 9/2008 |
| JP | 2009092982 A | 4/2009 |
| JP | 2009163862 A | 7/2009 |
| KR | 10-2007-0041878 A | 4/2007 |
| KR | 10-2008-0000746 A | 1/2008 |

* cited by examiner

| Stage | Precharge Time (μs) | | T04 Reduction Ratio |
|---|---|---|---|
| | Before | After | |
| ASG-1 | 6.3 | 6.3 | 0% |
| ASG-2 | 6.3 | 7.45 | 35% |
| ASG-3 | 12.5 | 12.5 | 35% |

GATE DRIVING CIRCUIT AND DISPLAY APPARATUS INCLUDING THE SAME

This application claims priority to Korean Patent Application No. 2009-0133158, filed on Dec. 29, 2009, and all the benefits accruing therefrom under 35 U.S.C. §119, the content of which in its entirety is herein incorporated by reference.

BACKGROUND OF THE INVENTION (1) Field of the Invention

The present invention relates to a gate driving circuit and a display apparatus having the gate driving circuit. More particularly, the present invention relates to a gate driving circuit having significantly reduced display defects and a display apparatus including the gate driving circuit.

(2) Description of the Related Art

In general, a liquid crystal display ("LCD") includes a liquid crystal display panel having a lower substrate, an upper substrate facing the lower substrate, and a liquid crystal layer interposed between the lower substrate and the upper substrate. The liquid crystal display panel typically includes gate lines, data lines, and pixels.

The liquid crystal display includes a gate driving circuit that sequentially outputs a gate pulse to the gate lines, and a data driving circuit that outputs a pixel voltage to the data lines. The gate driving circuit and the data driving circuit are typically mounted on a film or, alternatively, are mounted in a chip on the liquid crystal display panel, for example.

An amorphous silicon gate structure, in which the gate driving circuit is directly formed on the lower substrate through a thin film process, has been introduced in attempts to reduce a required number of chips in the LCD. In the amorphous silicon gate structure, the gate driving circuit typically includes at least one shift register, which includes a number of cascaded stages.

BRIEF SUMMARY OF THE INVENTION

Exemplary embodiments of the present invention provide a gate driving circuit that significantly reduces display defects in a display apparatus.

Exemplary embodiments of the present invention also provide a display apparatus including the gate driving circuit.

According to an exemplary embodiment, a gate driving circuit includes N stages (where N is a natural number greater than or equal to 2). The N stages are cascaded, and each of the N stages has a gate line connected thereto. A first stage group includes k stages of the N stages (where k is a natural number less than N), and the first stage group outputs a first output signal in response to a start signal. A second stage group (including N–k stages) generates a second output signal in response to the first output signal and outputs the second output signal to a corresponding gate line. The first stage group includes a first buffer and a second buffer, each of which receives the start signal. A size of the first buffer is smaller than a size of the second buffer.

The first stage group includes: a first stage; a second stage; and a third stage. The second stage group includes fourth through N-th stages.

The first buffer is included in the second stage, and the second buffer is included in the third stage.

The size of the first buffer is smaller than the size of the second buffer by about 35 percent.

The gate driving circuit may further include a dummy stage that applies a dummy output signal to the first stage group and the second stage group to lower the first output signal and the second output signal to a level of a gate-off voltage.

The first stage group and the second stage group each include: a voltage output part that applies a clock signal to the gate lines as a gate voltage in response to one of the start signal and an output signal outputted from a previous stage; an output driving part that receives one of the start signal and the output signal outputted from the previous stage to drive the voltage output part; a holding part that holds the gate lines at the gate-off voltage;

and a discharge part disposed at an end portion of the gate lines to discharge the gate lines to the gate-off voltage in response to the gate voltage outputted from the voltage output part.

The voltage output part includes a pull-up transistor including: a control electrode that receives the start signal or the output signal from the previous stage; an input electrode that receives the clock signal; and an output electrode connected to the gate line. The voltage output part further include a pull-down transistor including: a control electrode that receives the output signal from a next stage; an input electrode connected to the output electrode of the pull-up transistor; and an output electrode connected to an input terminal that receives the dummy output signal outputted from the dummy stage.

The first buffer and the second buffer each include a transistor including: an input electrode and a control electrode that receive the output signal from the previous stage; and an output electrode connected to the control electrode of the pull-up transistor.

The clock signal includes: a first clock signal, a second clock signal and a third clock signal, each of which is repeatedly turned on and off at different time delay periods;

and a fourth clock signal, a fifth clock signal and a sixth clock signal, each of which is repeatedly turned on and off and has a different phase from each of the first clock signal, the second clock signal and the third clock signal, respectively.

The different time delay periods include 1 horizontal (1H) period, and the phase difference is about 180 degrees)(°).

Another exemplary embodiment provides gate driving circuit including cascaded stages, and the gate driving circuit includes: a dummy stage group that receives a start signal and generates a first output signal; and a stage group that receives the first output signal outputted from the dummy stage group, generates a second output signal and applies the second output signal to a corresponding gate line. The dummy stage group drives the corresponding gate line during 3 horizontal periods.

The dummy stage group includes a first dummy stage, a second dummy stage and a third dummy stage.

Another exemplary embodiment provides a display apparatus including: pixels arranged in a matrix; gate lines that apply a gate signal to the pixels; data lines that apply a data signal to the pixels; a gate driver connected to the gate lines and which generates the gate signal based on at least one clock signal; a data driver connected to the data lines and which generates the data signal; and a controller that controls an operation of the gate driver and the data driver. The gate driver includes: a first stage group that receives a start signal, generates a first gate signal and applies the first gate signal to a corresponding gate line; and a second stage group that receives the first gate signal outputted from the first stage group, generates a second gate signal and applies the second gate signal to a corresponding gate line. The first stage group includes a first buffer and a second buffer, each of which receives the start signal, and a size of the first buffer is smaller than a size of the second buffer.

The first stage group includes a first stage, a second stage and a third stage, and the second stage group includes fourth through N-th stages, where N is a natural number.

The first buffer and the second buffer are included in the second stage and the third stage, respectively, and the size of the first buffer is smaller than the size of the second buffer by about 35%.

The first stage group and the second stage group each include: a voltage output part that applies a clock signal to the gate lines as a gate signal in response to one of the start signal and a signal outputted from a previous stage; an output driving part that receives the one of the start signal and the signal outputted from the previous stage and drives the voltage output part; a holding part that holds the gate lines at a gate-off voltage; and a discharge part disposed at an end portion of the gate lines to discharge the gate lines to the gate-off voltage in response to the gate voltage outputted from the voltage output part.

The clock signal includes: a first clock signal, a second clock signal and a third clock signal, each of which is repeatedly turned on and off at different time delay periods; and a fourth clock signal, a fifth clock signal and a sixth clock signal, each of which is repeatedly turned on and off and has a different phase from each of the first clock signal, the second clock signal and the third clock signal, respectively. The time delay period includes 1H period and the phase difference is about 180°.

In still another exemplary embodiment, a display apparatus includes: a substrate; a gate electrode disposed on the substrate and that receives one a gate on voltage and a gate off voltage; a first insulating layer disposed on the substrate and the gate electrode; a semiconductor layer disposed on the first insulating layer to form a channel; a source electrode disposed on the semiconductor layer and that receives an image voltage based on a voltage applied to the gate electrode; a drain electrode disposed on the semiconductor layer and that receives the image voltage from the source electrode; a second insulating layer disposed on the drain electrode and the source electrode; and a transparent conductive layer disposed on the second insulating layer between the drain electrode and the source electrode and that receives the gate-off voltage.

The gate-off voltage is a negative voltage, and the negative voltage is about −7.5 volts (V).

In still another exemplary embodiment, a gate driving circuit, in which N stages (where N is a natural number greater than or equal to 2) are cascaded and that apply a gate signal to corresponding gate lines, the gate driving circuit includes: a first stage group including k stages (where k is a natural number less than N, that receive a start signal; and a second stage group including N−k stages that receive an output signal outputted from a previous stage. Each of the N stages includes a buffer transistor that receives one of the start signal and the output signal, and a buffer transistor of at least one stage of the first stage group has a driving capacity different from a driving capacity of a buffer transistor of the second stage group.

The buffer transistor of at least one stage of the first stage group has a channel width smaller than a channel width of the buffer transistor of the second stage group.

The first stage group includes a first stage, a second stage and a third stage, and the second stage group includes fourth through N-th stages.

Buffer transistors of the second stage and the third stage have a width narrower than a width of the buffer transistors of the fourth through the N-th stages.

A buffer transistor of the first stage has a width wider than a width of the buffer transistors of the second stage and the third stage.

In yet another exemplary embodiment, a gate driving circuit, in which stages are cascaded, includes: a dummy stage that receives a driving start signal through a first input terminal thereof; and N main stages, where N is a natural number, that receive a carry signal outputted from one of the dummy stage and a previous stage through a first input terminal and which apply a gate signal to corresponding gate lines of N gate lines.

The dummy stage includes a first dummy stage, a second dummy stage and a third dummy stage, while the N main stages include a first main stage, a second main stage, a third main stage, a (3k−2)-th main stage, a (3k−1)-th main stage, a 3k-th main stage, a (3k+1)-th main stage, a (3k+2)-th main stage and a (3k+3)-th main stage (where k is a natural number). The first main stage, the second main stage and the third main stage receive an output signal from the first dummy stage, the second dummy stage and the third dummy stage, respectively, and the (3k+1)-th main stage, the (3k+2)-th main stage and the (3k+3)-th main stage receive an output signal from the (3k−2)-th main stage, the (3k−1)-th main stage and the 3k-th main stage, respectively.

In still another exemplary embodiment, in a gate driving circuit in which N stages are cascaded and apply a gate signal to corresponding gate lines, the gate driving circuit includes: a first stage group which includes k stages that receive a start signal; and a second stage group that includes N−k stages and receives an output signal outputted from a previous stage. Each of the N stages includes a buffer transistor that receives one of the start signals and a carry signal through a gate electrode, and a buffer transistor of at least one stage of the first stage group has a structure different from a structure of a buffer transistor of at least one stage of the second stage group.

A buffer transistor of at least one stage of the first stage group has a channel width narrower than a channel width of a buffer transistor of at least one stage of the second stage group.

The buffer transistor of at least one stage of the first stage group and the buffer transistor of at least one stage of the second stage group each includes: a gate electrode disposed on a substrate and that receives a gate on voltage and a gate off voltage; a first insulating layer disposed on the substrate and the gate electrode; a semiconductor layer disposed on the first insulating layer to form a channel; a source electrode disposed on the semiconductor layer and that receives an image signal based on a signal applied to the gate electrode; a drain electrode disposed on the semiconductor layer and that receives the image signal from the source electrode; and a second insulating layer disposed on the drain electrode and the source electrode. The buffer transistor of at least one stage of the first stage group further includes a conductive layer disposed on the second insulating layer between the drain electrode and the source electrode and that receives the gate-off voltage.

In yet another exemplary embodiment, a display apparatus includes: a display part that displays an image based on a gate signal and a data signal; a data driver that supplies the data signal to the display part; a gate driver including cascaded stages that output the gate signal to the display part in response to at least one clock signal; and a controller that controls an operation of the data driver and the gate driver. The gate driver includes N stages, the N stages being cascaded and configured to apply the gate signal to corresponding gate lines, and the N stages comprise: a first stage group including k stages that receives a start signal; and a second stage group including N−k stages that receive a signal outputted from a previous stage. Each stage includes a buffer transistor that receives one of the start signal and a carry signal, and a buffer transistor of at least one stage of the first stage group has a channel width that is different from a channel width of a buffer transistor of the second stage group.

The buffer transistor of the at least one stage of the first stage group has a channel width that is narrower than a channel width of the buffer transistor of the second stage group.

The first stage group includes a first stage, a second stage and a third stage, while the second stage group includes fourth through N-th stages.

A buffer transistor of the second stage and the third stage has a channel width that is narrower than a channel width of the buffer transistor of the first stage and the fourth through N-th stages.

The buffer transistor of the first stage has a channel width that is wider than the channel width of the buffer transistor of the second stage and the third stage.

Thus, according to the exemplary embodiments described herein, display defects are significantly reduced by adjusting a size of a transistor of a gate driving circuit, applying a gate-off voltage to the transistor, and/or adding a dummy stage to the gate driving circuit.

BRIEF DESCRIPTION OF THE DRAWINGS

The above and other aspects and advantages of the present invention will become more readily apparent by describing in further detail exemplary embodiments thereof with reference to the accompanying drawings, in which.

DETAILED DESCRIPTION OF THE INVENTION

Figure 1:
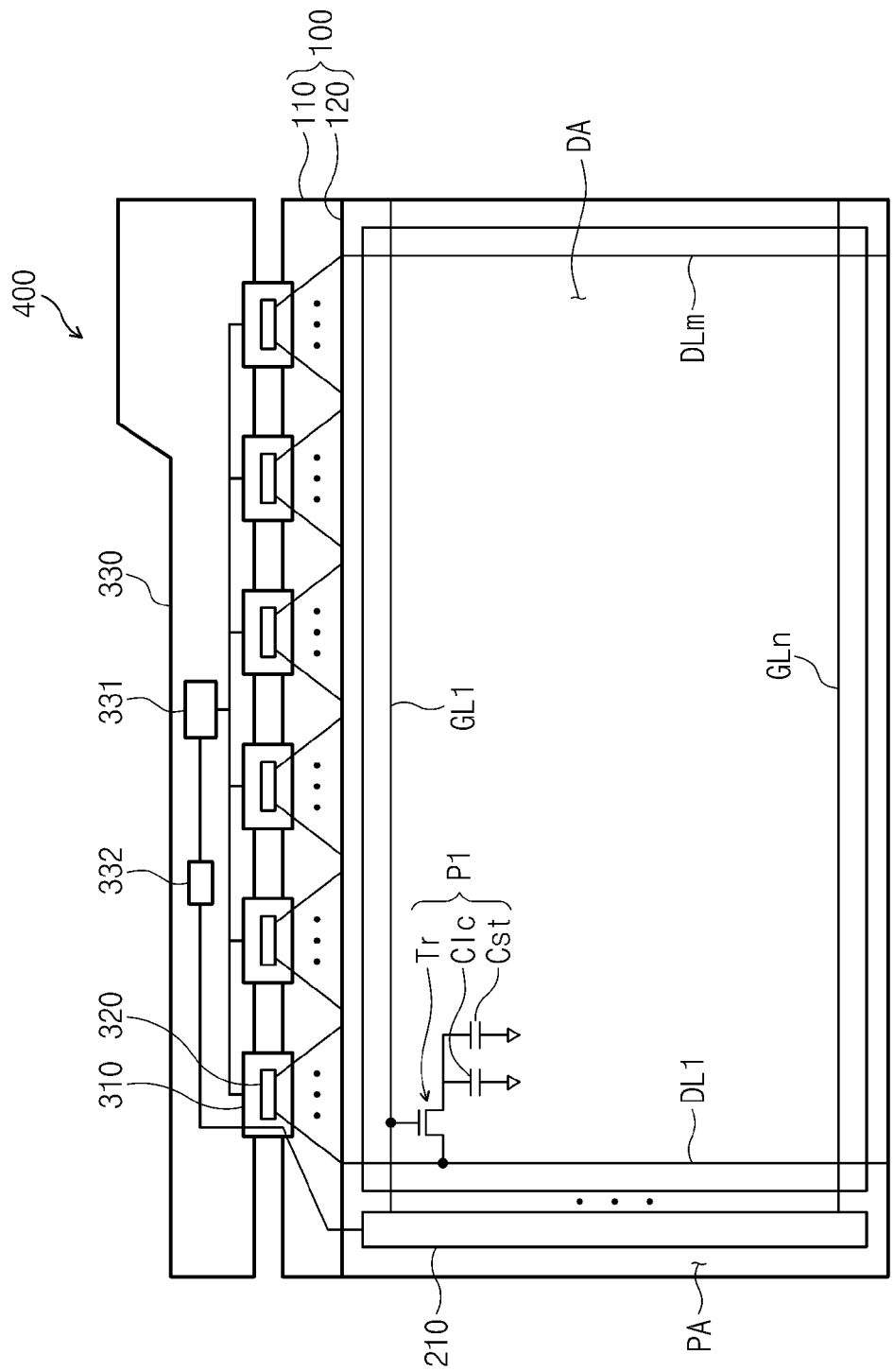
FIG. 1 is a plan view of an exemplary embodiment of a liquid crystal display ("LCD") according to the present invention.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art. Like reference numerals refer to like elements throughout.

As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present invention.

The terminology used herein is for the purpose of describing particular embodiments only and is not intended to be limiting. As used herein, the singular forms "a," "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, exemplary embodiments of the present invention will be described in further detail with reference to the accompanying drawings.

FIG. 1 is a plan view showing an exemplary embodiment of a liquid crystal display ("LCD") according to the present invention.

Referring to FIG. 1, a liquid crystal display 400 includes a liquid crystal display panel 100 for displaying an image, data driving chips 320 for outputting a data voltage to the liquid crystal display panel 100, and a gate driver 210 (e.g., a gate driving circuit 210) for outputting a gate voltage to the liquid crystal display panel 100.

The liquid crystal display panel 100 includes a lower substrate 110, an upper substrate 120 disposed opposite to, e.g., facing, the lower substrate 110, and a liquid crystal layer (not shown) interposed between the lower substrate 110 and the upper substrate 120.

The liquid crystal display panel 100 includes a display area DA on which an image is displayed and a peripheral area PA surrounding the display area DA, as shown in FIG. 1.

In the display area DA, a gate lines GL1-GLn and data lines DL1-DLm, which cross and are insulated from the gate lines GL1-GLn, are disposed. In addition, pixel areas which display the image, in response to driving voltages applied through the gate lines GL1-GLn and the data lines DL1-DLm, are disposed in the display area DA. In an exemplary embodiment, the pixel areas each have substantially the same structure and function, and thus only one pixel area (e.g., a first pixel area) will now be described in further detail as a representative example of all the pixel areas. The first pixel area includes a pixel P1 including a thin film transistor Tr, a liquid crystal capacitor Clc and a storage capacitor Cst. The thin film transistor Tr includes a gate electrode electrically connected to a first gate line GL1, a drain electrode electrically connected to a first data line DL1, and a source electrode electrically connected to a pixel electrode (not shown) that serves as a first electrode of the liquid crystal capacitor Clc. The storage capacitor Cst is connected in electrical parallel with the liquid crystal capacitor Clc.

The gate driving circuit 210 is disposed in the peripheral area PA adjacent to an end of the gate lines GL1-GLn. The gate driving circuit 210 is electrically connected to the end of the gate lines GL1-GLn to sequentially apply the gate voltage to the gate lines GL1-GLn. In an exemplary embodiment, the gate driving circuit 210 may be simultaneously formed with the thin film transistor Tr of the pixel area during a manufacturing process of the thin film transistor Tr, but additional exemplary embodiments are not limited thereto.

Driving circuit boards 310 (which, in an exemplary embodiment may be data driving chips 310) are disposed in the peripheral area PA adjacent to an end of the data lines DL1-DLm. In an exemplary embodiment, for example, the driving circuit boards 310 may be implemented in a tape carrier package ("TCP") or as a chip-on-film ("COF"), although additional exemplary embodiments are not limited thereto. Data driving chips 320 are disposed on the driving circuit boards 310 in one-to-one correspondence therewith, for example. The data driving chips 320 are electrically connected to the end of the data lines DL1-DLm to apply the data voltage to the data lines DL1-DLm.

The liquid crystal display 400 according to an exemplary embodiment further includes a control printed circuit board ("PCB") 330 that controls an operation of the gate driving circuit 210 and the data driving chips 320. The control printed circuit board 330 outputs a data control signal (to control the operation of the data driving chips 320), image data, and a gate control signal (to control the operation of the gate driving circuit 210).

As shown in FIG. 1, the control printed circuit board 330 includes a timing controller 331 that receives the image data from an external source (not shown) and generates the data control signal and a gate driving control signal, and a gate control circuit 332 that generates the gate control signal. In another exemplary embodiment, the control printed circuit board 330 may be a data printed circuit board that receives a control signal from another printed circuit board, which includes a timing controller, to generate the data control signal.

The timing controller 331 controls the operation of the data driving chips 320 and the gate driving circuit 210. The gate control circuit 332 generates a clock signal to drive the gate driving circuit 210 and a start signal STV to indicate a start of the gate signal.

The control printed circuit board 330 applies the data control signal and the image data to the data driving chips 320 through the driving circuit boards 310. In addition, the control printed circuit board 330 applies the gate control signal to the gate driving circuit 210 through the driving circuit board 310.

In another exemplary embodiment, each of the data driving chips 310 and the gate driving circuit 210 may be formed as a single integrated circuit ("IC") chip to be directly mounted on the liquid crystal display panel 100, attached to the liquid crystal display panel 100 after mounting on a flexible printed circuit film (not shown), or mounted on a separate printed circuit board (not shown). In addition, the data driving chips 310 and the gate driving circuit 210 may be integrated onto the liquid crystal display panel 100 together with the gate lines GL1-GLn, the data lines DL1-DLm and the thin film transistor Tr. Further, the data driving chips 310, the gate driving circuit 210, the timing controller 331, and the gate control circuit 332 may be integrated into a single chip, and at least one of the data driving chips 310, the gate driving circuit 210, the timing controller 331, and the gate control circuit 332 (and in this case at least one of those, for example the data driving chips 310, the gate driving circuit 210, the timing controller 331, and the gate control circuit 332) may be arranged outside of the single chip.

The gate driving circuit 210 according to an exemplary embodiment will now be described in further detail with reference to FIGS. 2A, 2B, 3 and 4.

Figure 2A:
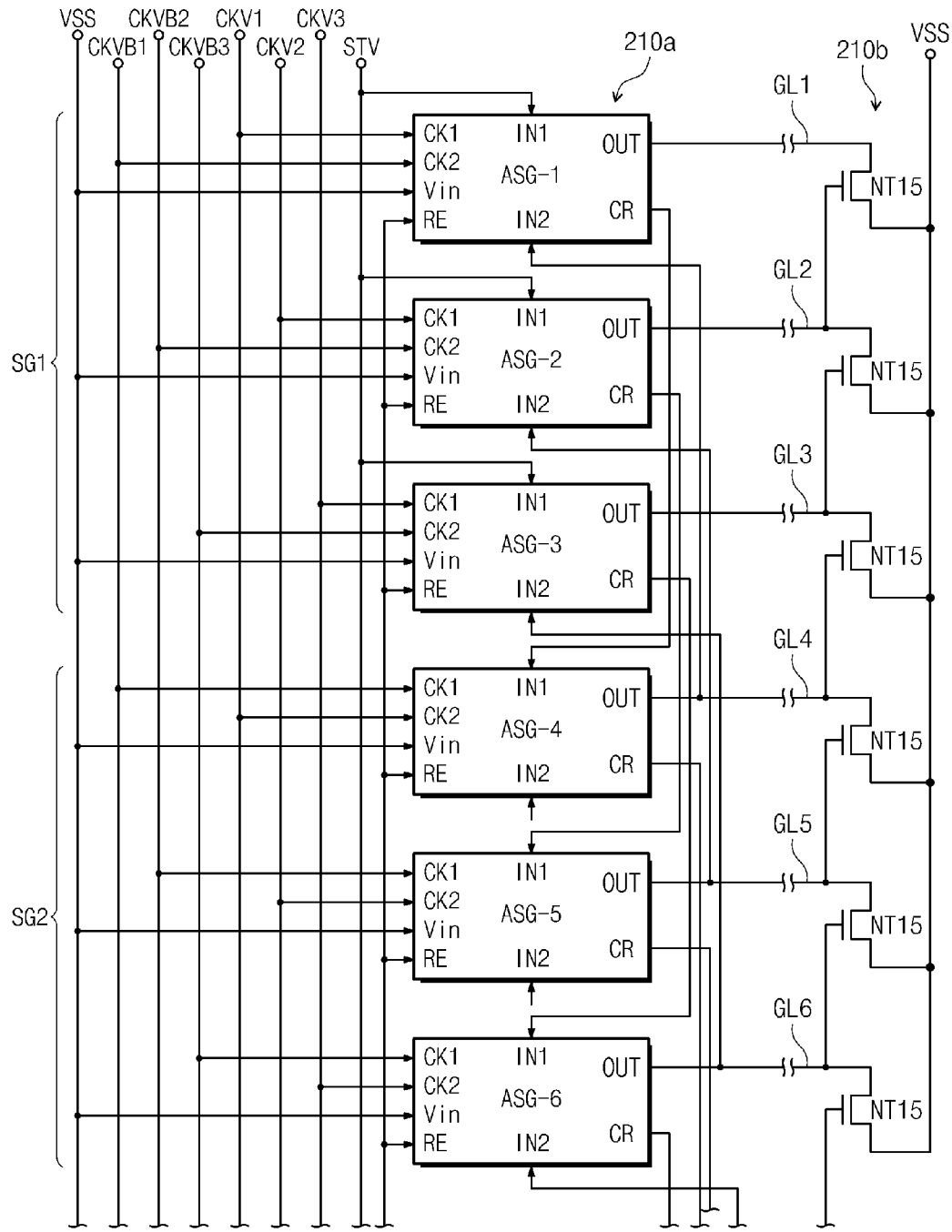
FIGS. 2A and 2B are block diagrams of a gate driving circuit of the LCD of FIG. 1.
Figure 2B:
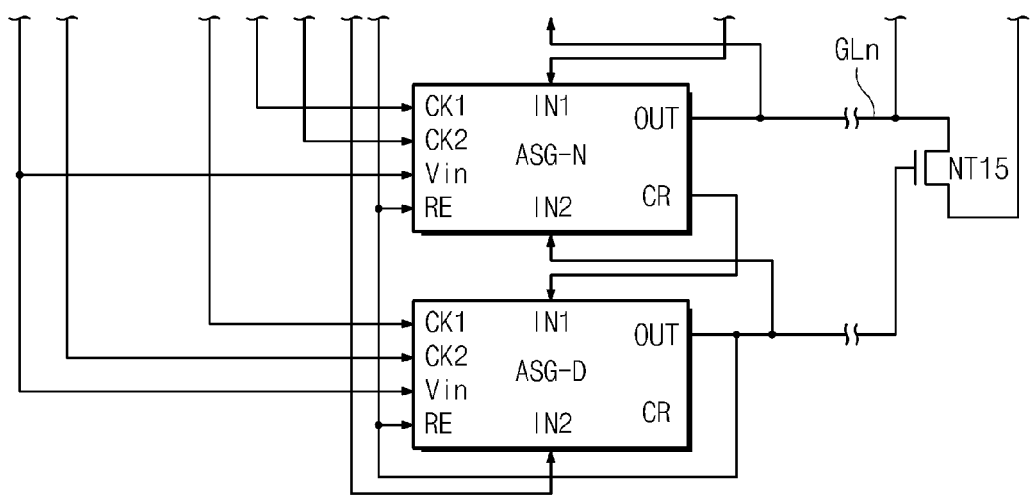

FIGS. 2A and 2B are block diagrams of a gate driving circuit of the LCD of FIG. 1.

Referring to FIGS. 2A and 2B, the gate driving circuit 210 includes a shift register 210a in which N stages, where 'N' is a natural number greater than or equal to two (2), ASG-1-

ASG-N, as well as a dummy stage ASG-D, are arranged. The N stages ASG-1-ASG-N are divided into a first stage group SG1 and a second stage group SG2. The gate driving circuit 210 further includes a discharge part 210b that is disposed adjacent to another end of the gate lines GL1-GLn to discharge a present gate line GL to an off voltage VSS in response to a gate voltage outputted from a next stage. In addition, the gate driving circuit 210 may further include a dummy stage (not shown) to drive a first stage ASG-1.

Each of the N stages ASG-1-ASG-N includes a first input terminal IN1, a first clock terminal CK1, a second clock terminal CK2, a second input terminal IN2, a voltage input terminal Vin, a reset terminal RE, an output terminal OUT and a carry terminal CR.

The first input terminal IN1 of each of the N stages ASG-1-ASG-N is electrically connected to the carry terminal CR of a previous stage or stages to receive a carry voltage. In an exemplary embodiment, each of the N stages ASG-1-ASG-N receives the carry voltage from an earlier stage with three stages. Specifically, for example, an N-th stage ASG-N receives the carry voltage from an (N−3)-th stage ASG-(N-3). Also, the first input terminals IN1 of the first stage ASG-1, the second stage ASG-2, and the third stage ASG-3 receive the start signal STV, which indicates the start of an operation of the gate driving circuit 210, instead of receiving the carry voltage of a previous stage. The first through the third stages ASG-1 through ASG-3, respectively, to which the start signal STV is applied, are included in the first stage group SG1. Thus, the second stage group SG2 includes remaining stages ASG-4-ASG-N and the dummy stage ASG-D.

The second input terminal IN2 of each of the N stages ASG-1-ASG-N is electrically connected to an output terminal OUT of one of the next stages to receive the gate voltage therefrom. However, the second input terminal IN2 of the dummy stage ASG-D receives the start signal STY. The dummy stage ASG-D is used to lower the gate voltage of the N stages ASG-1-ASG-N to an off voltage level.

Except for the dummy stage ASG-D, the N stages ASG-1-ASG-N receives one of a first clock CKV1, a second clock CKV2 and a third clock CKV3 and one of a fourth clock CKVB1, a fifth clock CKVB2 and a sixth clock CKVB3, which have a phase difference different from the first CKV1, second clock CKV2 and the third clock CKV3, respectively. Specifiaclly, for example, the first clock CKV1 is applied to the first clock terminal CK1 of (6N−5)-th stages ASG-1, ASG-7, . . . , ASG-6N-5 among the N stages ASG-1-ASG-N and the fourth clock CKVB1 is applied to the second clock terminal CK2 of (6N−5)-th stages ASG-1, ASG-7, . . . , ASG-6N-5. The second clock CKV2 is applied to the first clock terminal CK1 of (6N−4)-th stages ASG-2, ASG-8, . . . , ASG-6N-4 and the fifth clock CKVB2 is applied to the second clock terminal CK2 of (6N−4)-th stages ASG-2, ASG-8, . . . , ASG-6N-4. Also, the third clock CKV3 is applied to the first clock terminal CK1 of (6N−3)-th stages ASG-3, ASG-9, . . . , ASG-6N-3 and the sixth clock CKVB3 is applied to the second clock terminal CK2 of (6N−3)-th stages ASG-3, ASG-9, . . . , ASG-6N-3. In addition, the fourth clock CKVB1 is applied to the first clock terminal CK1 of (6N−2)-th stages ASG-4, ASG-10, . . . , ASG-6N-2 among the N stages ASG-1-ASG-N and the first clock CKV1 is applied to the second clock terminal CK2 of (6N−2)-th stages ASG-4, ASG-10, . . . , ASG-6N-2. The fifth clock CKVB2 is applied to the first clock terminal CK1 of (6N−1)-th stages ASG-5, ASG-11, . . . , ASG-6N-1 and the second clock CKV2 is applied to the second clock terminal CK2 of (6N−1)-th stages ASG-5, ASG-11, . . . , ASG-6N-1. Also, the sixth clock CKVB3 is applied to the first clock terminal CK1 of 6N-th stages ASG-6, ASG-12, . . . , ASG-6N and the third clock CKV3 is applied to the second clock terminal CK2 of 6N-th stages ASG-6, ASG-12, . . . , ASG-6N. The phase of the first to third clocks CKV1-CKV3 and the phase of the fourth to sixth clocks CKVB1-CKVB3 will be described later.

The off voltage VSS is applied to the voltage input terminal Vin of the N stages ASG-1-ASG-N and the dummy stage ASG-D to turn off the gate lines GL. Also, the output terminal OUT of the dummy stage ASG-D is electrically connected to the reset terminal RE of the N stages ASG-1-ASG-N.

The gate lines GL1-GLn are electrically connected to the output terminals OUT of the N stages ASG-1-ASG-N in a one-to-one correspondence. Thus, the N stages ASG-1-ASG-N sequentially output the gate voltage to the gate lines GL1-GLn through the output terminals OUT. As shown in FIGS. 2A and 2B, in an exemplary embodiment, the shift register 210a is disposed at an end of the gate lines GL1-GLn, but additional exemplary embodiments are not limited thereto or thereby. Thus, the shift register 210a may be disposed at another opposite end of the gate lines GL1-GLn. In addition, the shift register 210a may be disposed at both ends of the gate lines GL1-GLn after being divided into two stage groups, for example.

The discharge part 210b includes a first discharge transistor NT15 that discharges the present gate line among the gate lines GL1-GLn to the off voltage VSS. The first discharge transistor NT15 includes a control electrode connected to a next gate line, an input electrode receiving a gate voltage of a present stage and an output electrode receiving the off voltage VSS.

Figure 3:
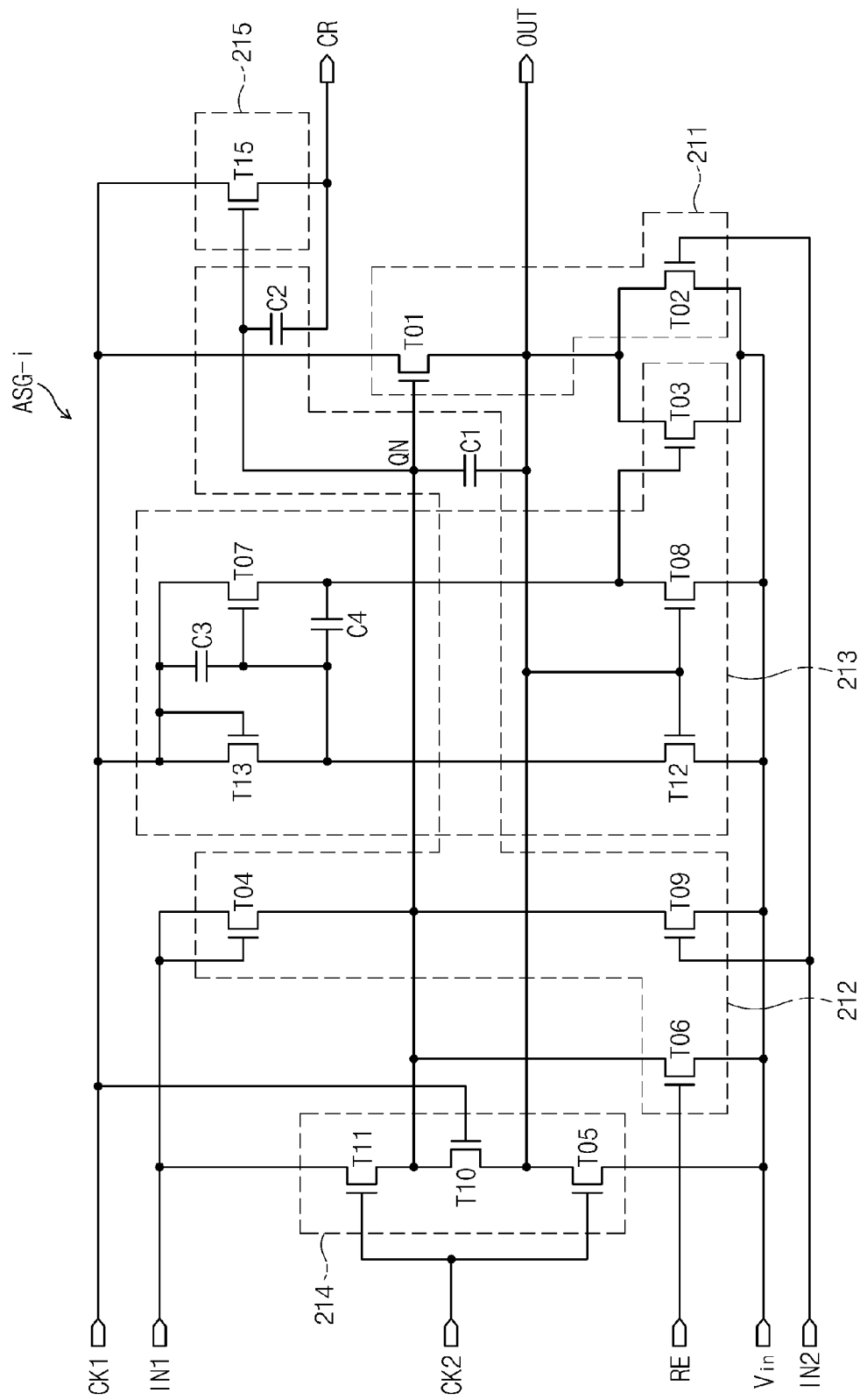
FIG. 3 is a schematic circuit diagram of an exemplary embodiment of a stage of a gate driving circuit according to the present invention.
Figure 4:
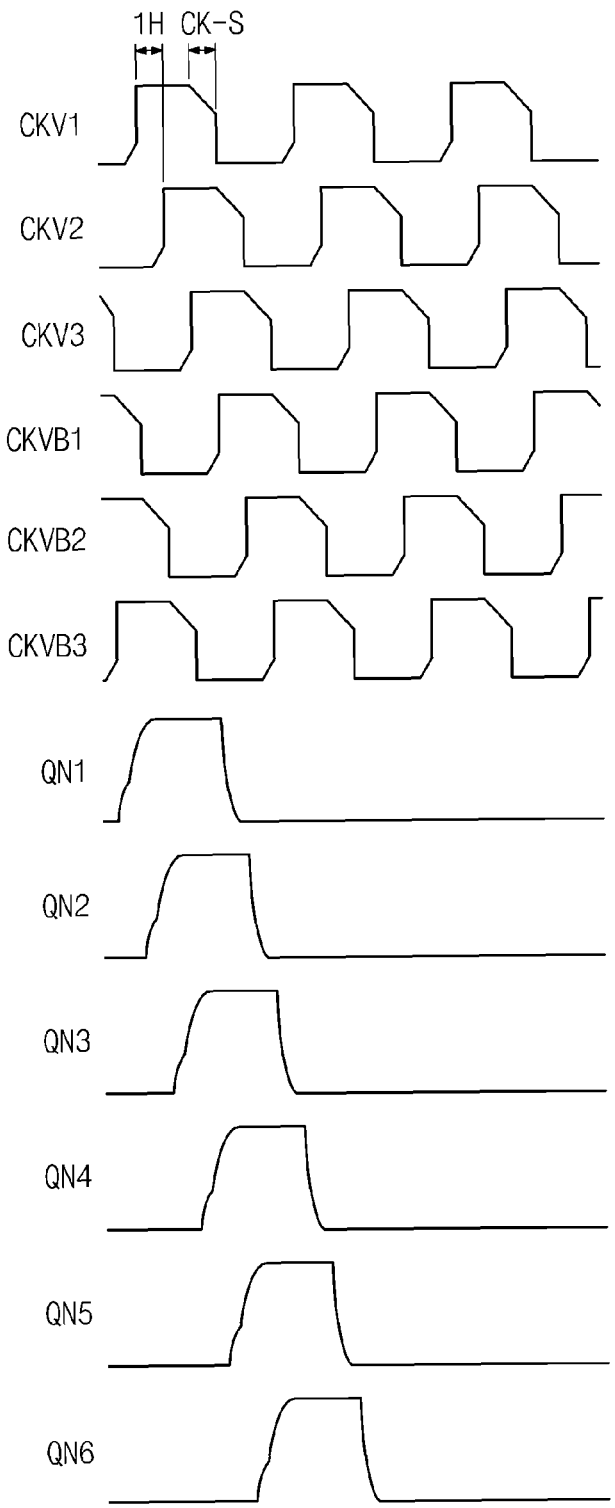
FIG. 4 is a signal timing diagram showing clock signals applied to an exemplary embodiment of a gate driving circuit and a Q-node voltage of each stage of the gate driving circuit according to the present invention.

FIG. 3 is a schematic circuit diagram of an exemplary embodiment of a stage of a gate driving circuit according to the present invention, and FIG. 4 is a signal timing diagram showing clock signals and a node voltage of each stage of the gate driving circuit shown in FIG. 2. In an exemplary embodiment, the stages of the gate driving circuit have substantially the same structure and function (except the dummy stage ASG-D), and only one stage will therefore be described in further detail, while the more detailed descriptions of the other stages will be simplified or omitted.

Referring to FIG. 3, each stage includes a voltage output part 211 for applying the gate voltage to a corresponding gate line, an output driving part 212 for driving the voltage output part 211, as well as a first holding part 213 and a second holding part 214 for holding a corresponding gate line at a voltage of a first level.

The voltage output part 211 includes a pull-up transistor T01 and a pull-down transistor T02. The pull-up transistor T01 includes a control electrode connected to an output terminal QN (hereinafter, referred to as a "Q-node") of the output driving part 212, an input electrode connected to the first clock terminal CK1 and an output electrode connected to the output terminal OUT.

Referring to FIG. 4, each stage receives one of the first through third clocks CKV1-CKV3 and one of the fourth through sixth clocks CKVB1-CKVB3 having the phase difference from the first to third clocks CKV1-CKV3. The first through sixth clocks CKV1-CKVB3 have a pulse width corresponding to a gate on/off voltage. For example, the first to sixth clocks CKV1-CKVB3 have a voltage level of about 30 volts (V) to about −8V, and the voltage level may be changed according to a voltage used to drive a gate. One clock of the first through third clocks CKV1-CKV3 and one clock of the fourth through sixth clocks CKVB1-CKVB3 are applied to a given stage as a pair. More particularly, the first clock CKV1 and the fourth clock CKVB1 are applied to the (6N−5)-th stage and the (6N−2)-th stage, the second clock CKV2 and the fifth clock CKVB2 are applied to the (6N−4)-th stage and the (6N−1)-th stage, and the third clock CKV3 and the sixth clock CKVB3 are applied to the (6N−3)-th stage and the 6N-th stage.

The first through third clocks CKV1-CKV3 have the phase that is different from the fourth through sixth clocks CKVB1-CKVB3. Specifically, the first clock CKV1 and the fourth clock CKVB1 have a phase difference of about 180 degrees) (°), the second clock CKV2 and the fifth clock CKVB2 have a phase difference of about 180 degrees, and the third clock CKV3 and the sixth clock CKVB3 have a phase difference of about 180 degrees. However, the above-listed phase differences may be set at a point different from, e.g., less than, 180 degrees. The second clock CKV2 may be delayed by 1 horizontal ("H") period from the first clock CKV1, and the third clock CKV3 may be delayed by the 1H period from the second clock CKV2.

Each of the first through sixth clocks CKV1-CKVB3 includes a kick-back compensation period CK-S during which the driving voltage is lowered to compensate for a kick-back caused by the output voltage of the gate driver 210.

One stage ASG-i that is operated in response to the first clock CKV1 and the fourth clock CKVB1 will now be described in further detail.

Referring again to FIG. 3, the pull-transistor T01 pulls up the gate voltage of a present stage, which is outputted to the output terminal OUT, to the first clock CKV1 (shown in FIG. 4) applied through the first clock terminal CK1 in response to a control voltage outputted from the output driving part 212. The pull-up transistor T01 is turned on during 3H periods, corresponding to a high period of the first clock CKV1, in one frame to maintain the gate voltage of the present stage at a logic high state, as shown in FIG. 4.

The pull-down transistor T02 includes a control electrode connected to the second input terminal IN2, an output electrode connected to the voltage input terminal Vin and an input electrode connected to the output terminal OUT. Thus, the pull-down transistor T02 pulls down the gate voltage of the present stage, that is pulled up to the first clock CKV1, to the off voltage VSS (FIG. 2) applied through the voltage input terminal Vin in response to the gate voltage of a next stage, e.g., a subsequent adjacent stage. Put another way, the pull-down transistor T02 is turned on after the 3H periods to pull down the gate voltage of the present stage to a logic low state.

The output driving part 212 includes a buffer transistor T04, a first capacitor C1, a second capacitor C2, a discharge transistor T09 and a reset transistor T06.

The buffer transistor T04 includes an input electrode and a control electrode that are commonly connected to the first input terminal IN1 and an output electrode connected to the Q-node QN. The first capacitor C1 is connected to between the Q-node QN and the output terminal OUT, and the second capacitor C2 is connected to between a control electrode of a carry transistor T15 and the carry terminal CR. The discharge transistor T09 includes an input electrode connected to the output electrode of the buffer transistor T04, a control electrode connected to the second input terminal IN2 and an output electrode connected to the voltage input terminal Vin.

The reset transistor T06 includes a control electrode connected to the reset terminal RE, an input electrode connected to the control electrode of the pull-up transistor T01, and an output electrode connected to the voltage input terminal Vin. The reset transistor T06 discharges a ripple voltage input through the first input terminal IN1 to the off voltage VSS in response to a last carry voltage that is input through the reset terminal RE and output from a last stage ASG-D. Therefore, the pull-up transistor T01 and the carry transistor T15 are turned off in response to a dummy carry voltage of the dummy stage ASG-D. Consequently, the dummy carry voltage is applied to the reset terminal RE of the N stages that are arranged prior to the dummy stage ASG-D to turn off the pull-up transistor T01 and the carry transistor T15 of the N stages, thereby resetting the N stages.

When the buffer transistor T04 is turned on in response to the carry voltage of a previous stage, the first and second capacitors C1 and C2 are charged by a voltage of the Q-node QN of FIG. 4. If electric charges higher than a threshold voltage Vth of the pull-up transistor T01 are charged to the first capacitor C1, an electric potential of the Q-node QN increases higher than the threshold voltage, to thereby turn on the pull-up transistor T01 and the carry transistor T15. In this case, since the first clock CKV1 goes to a logic low state, the gate voltage and the carry voltage of the present stage are maintained at the logic low state during a low period (e.g., for 1H period). Then, when the first clock CKV1 becomes a logic high state once again, the first clock CKV1 is outputted through the output terminal OUT and the carry terminal CR, and the gate voltage and the carry voltage of the present stage are transited to the high state. In other words, the gate voltage and the carry voltage of the present stage are maintained during a high period (e.g, during 1H period) of the first clock CKV1.

When the discharge transistor T09 is turned on, in response to a gate voltage of a next stage, the electric charges charged into the first capacitor C1 are discharged to the off voltage VSS through the discharge transistor T09. Therefore, the electric potential of the Q-node QN is lowered to the off voltage VSS. As a result, the pull-up transistor T01 and the carry transistor T15 are turned off. In other words, since the discharge transistor T09 is turned on after the 3H periods, to turn off the pull-up transistor T01 and the carry transistor T15, the discharge transistor T09 prevents the gate voltage and the carry voltage of the present stage, in the logic high state, from being outputted to the output terminal OUT and the carry terminal CR.

The first holding part 213 according to an exemplary embodiment includes a first inverter transistor T13, a second inverter transistor T07, a third inverter transistor T12, a fourth inverter transistor T08, a fifth inverter transistor T03, a third capacitor C3 and a fourth capacitor C4.

The first inverter transistor T13 includes an input electrode and a control electrode, which are commonly connected to the first clock terminal CK1, and an output electrode connected to an output electrode of the second inverter transistor T07 through the fourth capacitor C4. The second inverter transistor T07 includes an input electrode connected to the first clock terminal CK1, a control electrode connected to the input electrode thereof through the third capacitor C3 and an output electrode connected to a control electrode of the fifth inverter transistor T03. The third inverter transistor T12 includes an input electrode connected to the output electrode of the first inverter transistor T13, a control electrode connected to the output terminal OUT and an output electrode connected to the voltage input terminal Vin. The fourth inverter transistor T08 includes an input electrode connected to the control electrode of the fifth inverter transistor T03, a control electrode connected to the output terminal OUT and an output electrode connected to the voltage input terminal Vin. The fifth inverter transistor T03 includes a control electrode connected to the output electrode of the second inverter transistor T07, an input electrode connected to the voltage input terminal Vin and an output electrode connected to the output terminal OUT.

The third and fourth inverter transistors T12 and T08, respectively, are turned on in response to the gate voltage of the present stage in the high state, which is outputted to the output terminal OUT, and the first clock CKV1 outputted from the first and second inverter transistors T13 and T07, respectively, is discharged to the off voltage VSS. Thus, the fifth inverter transistor T03 is maintained at the turned-off state during the 3H periods in which the gate voltage of the present stage is maintained at the logic high state. Then, when the gate voltage of the present stage transitions to the logic low state, the third and fourth inverter transistors T12 and T08, respectively, are turned off. Therefore, the fifth inverter transistor T03 is turned on in response to the first clock CKV1 outputted from the first and second inverter transistors T13 and T07, respectively. Consequently, the gate voltage of the present stage is held at the off voltage VSS by the fifth inverter transistor T03 in the high period of the first clock CKV1 during a remaining period (e.g., except for the 3H periods of one frame).

The second holding part 214 according to one or more exemplary embodiments includes a first ripple preventing transistor T10, a second ripple preventing transistor T11 and a third ripple preventing transistor T05, which prevent the gate voltage and the carry voltage of the present stage from being rippled by the first clock CKV1 or the fourth clock CKVB1 during (N–3)H periods.

The first ripple preventing transistor T10 includes a control electrode connected to the first clock terminal CK1, an input electrode connected to the output terminal OUT and an output electrode connected to the Q-node QN. The second ripple preventing transistor T11 includes a control electrode connected to the second clock terminal CK2, an input electrode connected to the first input terminal IN1 and an output electrode connected to the Q-node QN. The third ripple preventing transistor T05 includes a control electrode connected to the second clock terminal CK2, an input electrode connected to the output terminal OUT and an output electrode connected to the voltage input terminal Vin.

The first ripple preventing transistor T10 provides the gate voltage of the present stage, which has the same voltage level as the off voltage VSS, outputted from the output terminal OUT to the Q-node QN in response to the first clock CKV1. Thus, the electric potential of the Q-node QN is maintained at the off voltage VSS during the high period of the first clock CKV (from among the (N-3)H periods). As a result, the first ripple preventing transistor T10 prevents the pull-up transistor T01 and the carry transistor T15 from being turned on during the high period of the first clock CKV1 (from among the (N-3)H periods).

The second ripple preventing transistor T11 provides an output voltage of the previous stage, which has substantially the same voltage level as the off voltage VSS, inputted through the first input terminal IN1 to the Q-node QN in response to the fourth clock CKVB1 (FIG. 4) provided through the second clock terminal CK2. Thus, the electric potential of the Q-node is maintained at the off voltage VSS during the high period of the fourth clock CKVB1 from among the (N-3)H periods. As a result, the second ripple preventing transistor T11 prevent the pull-up transistor T01 and the carry transistor T15 from being turned on during the high period of the fourth clock CKVB1 from among the (N-3)H periods.

The third ripple preventing transistor T05 discharges the gate voltage of the present stage to the off voltage VSS in response to the fourth clock CKVB1. Therefore, the third ripple preventing transistor T05 maintains the gate voltage of the present stage at the off voltage VSS in the high period of the fourth clock CKVB1 during the (N-3)H periods.

In an exemplary embodiment, each stage further includes a carry part 215 that transmits the output voltage of the present stage to the next stage. The carry part 215 includes the carry transistor T15 having a control electrode connected to the Q-node QN, an input electrode connected to the first clock terminal CK1 and an output electrode connected to the output terminal OUT. Thus, the carry transistor T15 pulls up the carry voltage of the present stage that is output to the carry terminal CR to the first clock CKV1 in response to the control voltage output from the output driving part 212. The carry transistor T15 is turned on only during the 3H periods in one frame, to thereby maintain the carry voltage of the present stage at the logic high state during the 3H period.

Figure 5A:
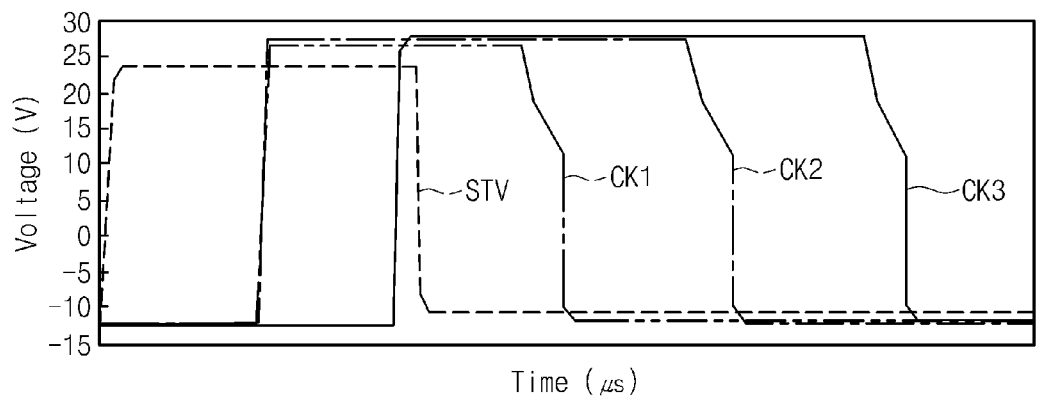
FIG. 5A is a signal timing diagram showing a start signal and clock signals applied to an exemplary embodiment of a gate driving circuit according to the present invention.
Figure 5B:
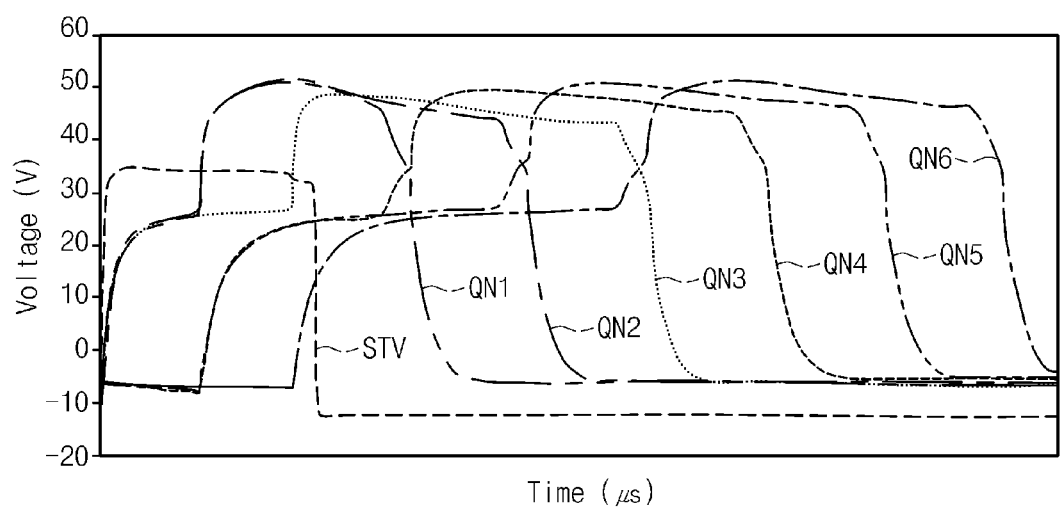
FIG. 5B is a signal timing diagram showing a voltage of a Q-node of each stage when an exemplary embodiment of a gate driving circuit according to the present invention is initially operated.

FIG. 5A is a signal timing diagram showing a start signal and clock signals applied to an exemplary embodiment of a gate driving circuit according to the present invention, and FIG. 5B is a signal timing diagram showing a Q-node of each stage when an exemplary embodiment of a gate driving circuit according to the present invention is initially operated.

Referring to FIGS. 5A and 5B, when the gate driving circuit 210 is initially operated, the gate control circuit 332 (shown in FIG. 1) generates the start signal STV, indicating the start of the gate signal, the first through third clocks CKV1-CKV3, and the fourth through sixth clocks CKVB1-CKVB3 to apply the start signal STV, the first through third clocks CKV1-CKV3, and the fourth through sixth clocks CKVB1-CKVB3 to the first clock terminal CK1 and the second clock terminal CK2 of each stage. When the gate driving circuit 210 is driven for a long time and/or under high temperature, for example, a reliability defect in which the second gate line GL2 and the third gate line GL3 appear relatively darker than other gate lines may occur.

Specifically, the reliability defect occurs when the electric charge charged to the Q-node QN leaks through a wire (e.g., through a wire which the start signal STV is applied) connected to the buffer transistor T04 of the output driving part 212, which causes a leakage current, since the time intervals between clocks that are applied to the first stage ASG-1 to third stage ASG-3 are different from each other when the gate driving circuit 210 is initially driven. Therefore, an amount of the leakage current leaked through the buffer transistor T04 is different and the output voltage of the gate line is varied. As a result, the gate lines connected to the first stage ASG-1 to third stage ASG-3 appear relatively darker than the other gate lines connected to the fourth stage ASG-4 or the stages after the fourth stage ASG-4, thereby causing the reliability defect. In particular, the increase in the amount of the leakage current of the buffer transistor T04 causes the voltage of the Q-node QN to lower, and thus a falling time delay is caused at the initial period during which the off voltage of the first clock CKV1 is applied to the pull-up transistor T01 of each stage. Since the gate voltage corresponding to the kick-back compensation period CK-S decreases as the falling time is delayed, a kick-back voltage increases. The kick-back voltage can be expressed as Equation 1.

$$Vkb = \left(\frac{Cgs}{Clc} + Cst + Cgs\right) \times (Von - Voff) \quad \text{[Equation 1]}$$

In Equation 1, Vkb denotes a kick-back voltage, Cgs denotes a gate-source capacitance, Clc denotes a liquid crystal capacitance, Cst denotes a storage capacitance, Von denotes a gate-on voltage and Voff denotes a gate-off voltage.

In Equation 1, when the value of (Von–Voff) increases, the kick-back voltage increases, and the deviation of the Q-node QN increases. Also, as the gate-on voltage Von becomes high, the kick-back voltage increases, thereby increasing the deviation of the kick-back voltage. Therefore, the deterioration in brightness is caused by the variation of the gate voltage, and thus the reliability defect occurs as the gate lines connected to the first to third stages ASG-1-ASG-3 appear relatively darker than the gate lines connected to the fourth stage ASG-4 and/or the stages after the fourth stage ASG-4.

To prevent the occurrence of the reliability defect, in an exemplary embodiment, a size of the buffer transistor T04 is changed, e.g., is reduced, such that the charging time for the electric charge is sufficiently provided to the Q-node QN.

Figure 6:
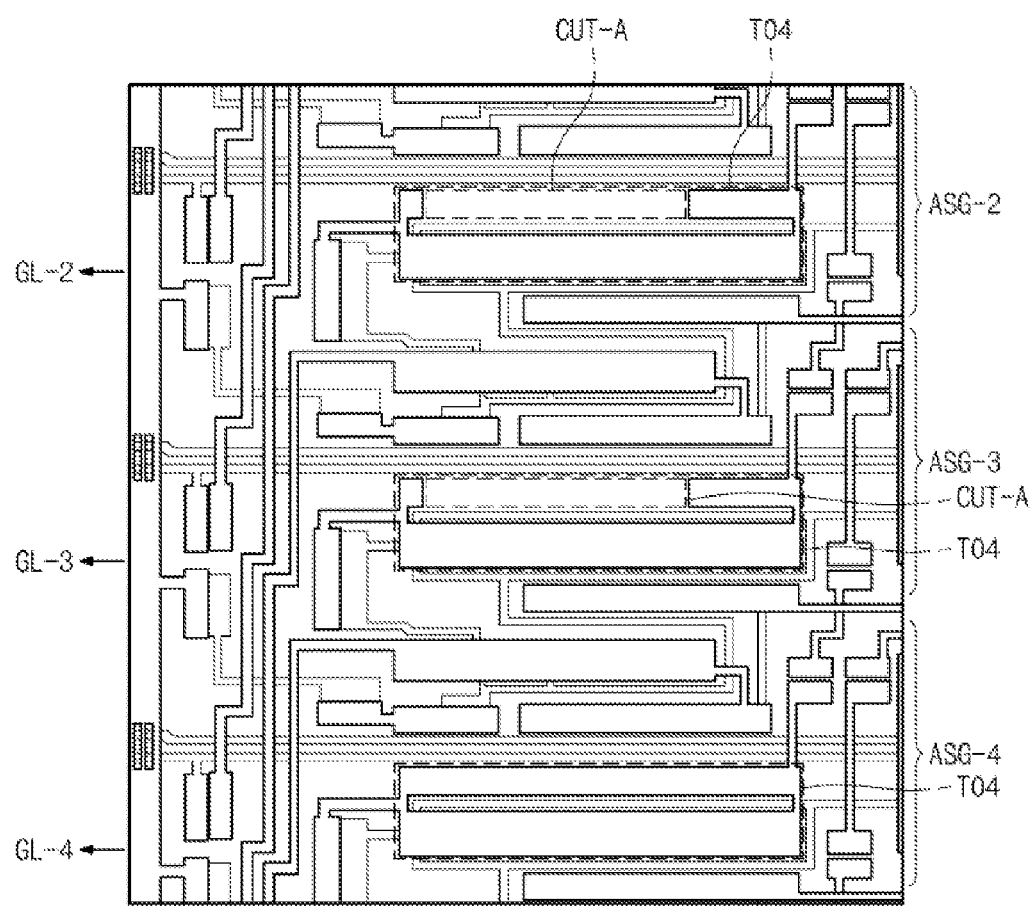
FIG. 6 is a plan view of an exemplary embodiment of a resized buffer transistor according to the present invention.
Figure 7A:
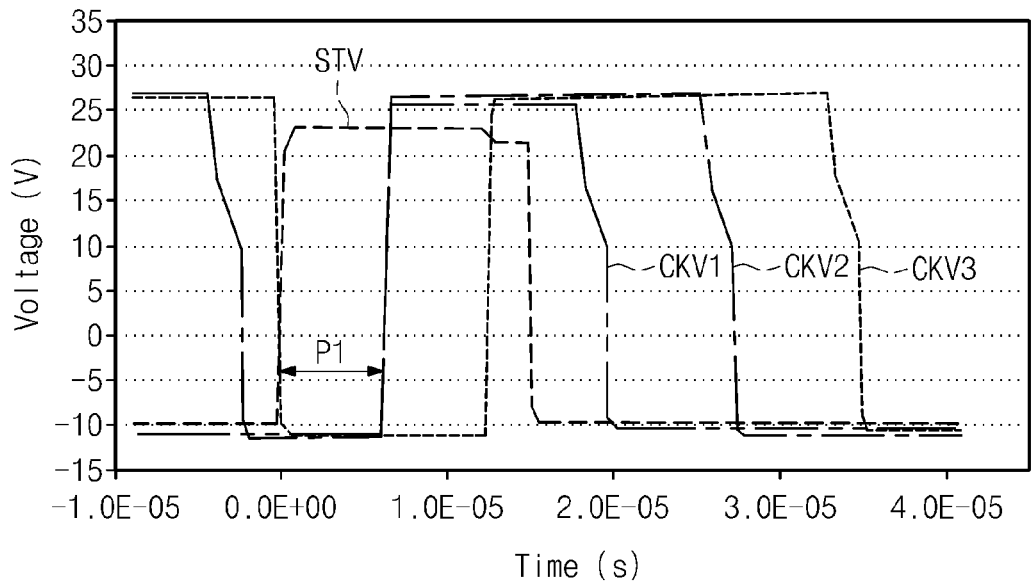
FIG. 7A is a signal timing diagram showing first through third clocks of a conventional LCD of the prior art.
Figure 7B:
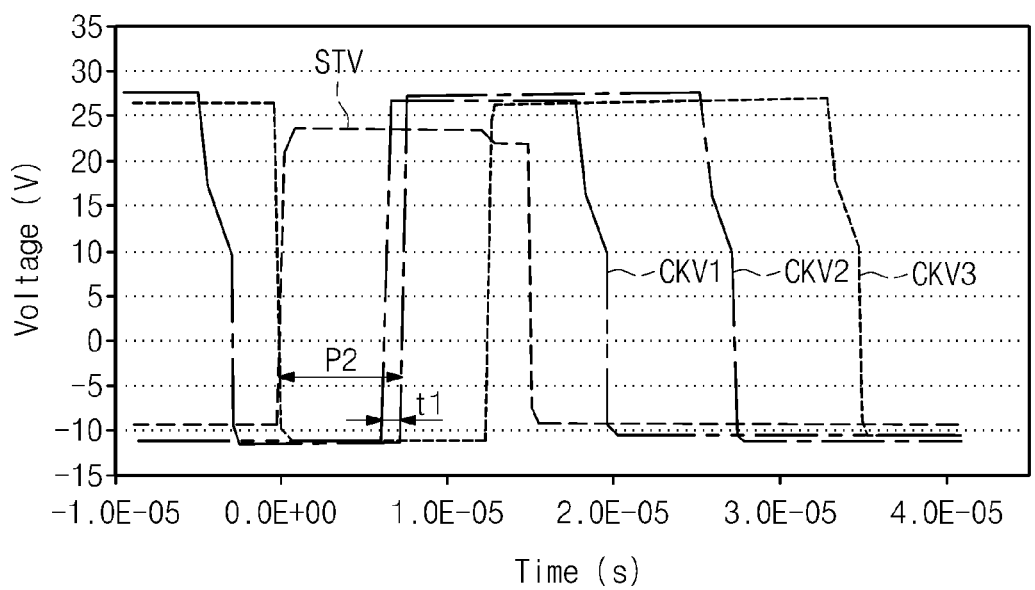
FIG. 7B is a signal timing diagram showing first through third clocks adjusted according to a size of an exemplary embodiment of a buffer transistor according to the present invention.
Figures 7C, 8:
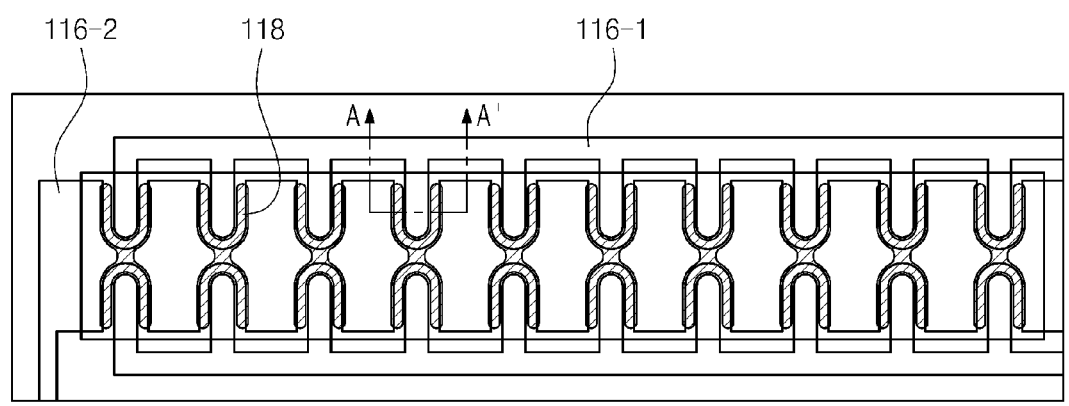
FIG. 7C is a table showing a reduction ratio in size and a precharge time of an exemplary embodiment of a buffer transistor in each of first through third stages according to the present invention.
FIG. 8 is a plan view showing an exemplary embodiment of a buffer transistor according to the present invention.

FIG. 6 is a plan view showing an exemplary embodiment of a resized buffer transistor according to the present invention. FIG. 7A is a signal timing diagram showing first to third clocks of a convention LCD according to the prior art, FIG. 7B is a signal timing diagram showing first through third clocks that are adjusted according to a size of an exemplary embodiment of a buffer transistor according to the present invention, and FIG. 7C is a table showing a reduction ratio in size and a precharge time of an exemplary embodiment of a buffer transistor in the first through third stages thereof according to the present invention.

As shown in FIG. 6, in an exemplary embodiment, a cutting area CUT-A of the buffer transistor T04 is removed to reduce the size of the buffer transistor T04. Specifiaclly, the buffer transistor T04 according to one or more exemplary embodiments has a size that is smaller by about 35 percent (%) than a size of a conventional buffer transistor.

As shown in FIG. 6, the cutting area CUT-A may be formed by a mask repair method, for example. Specifically, the mask repair method according to an exemplary embodiment is a method that decreases a channel width of the transistor by cutting portions of wires of the transistor formed through a manufacturing process using a laser beam to float the transistor. Thus, the size of the transistor is reduced by cutting a portion of source and drain wires associated therewith. Thus, in an exemplary embodiment, the portions of the wires of the buffer transistor T04 may be cut using the laser beam, thereby decreasing the size of the buffer transistor T04. In an exemplary embodiment, the mask repair method reduces the size of the buffer transistor T04, and the mask repair method also reduces a manufacturing cost of the lower substrate 110. In an additional exemplary embodiment, however, the size of the buffer transistor T04 may be reduced by decreasing the size of a mask when designing the layout of the wires. Since a reduction ratio of a size of the buffer transistor T04 depends on its driving timing, the size of the buffer transistor T04 is reduced to coincide with the timing at which the voltage of the Q-node QN of the second gate line GL2 and the third gate line GL3 is lowered to the off-voltage VSS with the timing at which the voltage of the Q-node QN of the remaining gate lines including the fourth gate line GL4 is lowered to the off voltage VSS.

In an exemplary embodiment in which the size of the buffer transistor T04 of the second stage ASG-2 is reduced, the charge time of the Q-node QN may be decreased. Therefore, as shown in FIGS. 7A and 7B, a timing of the second clock CKV2 is reduced by a predetermined time t1, so that the precharge time in which the electric charge is charged to the Q-node QN of the second stage ASG-2 in response to the start signal STV may be increased to be 1H period or more. As shown in FIG. 7C, a precharge capacity of the Q-node QN of the second stage ASG-2 may be compensated by reducing the size of the buffer transistor T04 of the second and third stages ASG-2 and ASG-3 by about 35% and by changing the pre-charge time of the second clock CKV2 from about 6.3 microseconds (μs) (P1) to about 7.45 μs (P2).

Figure 9:
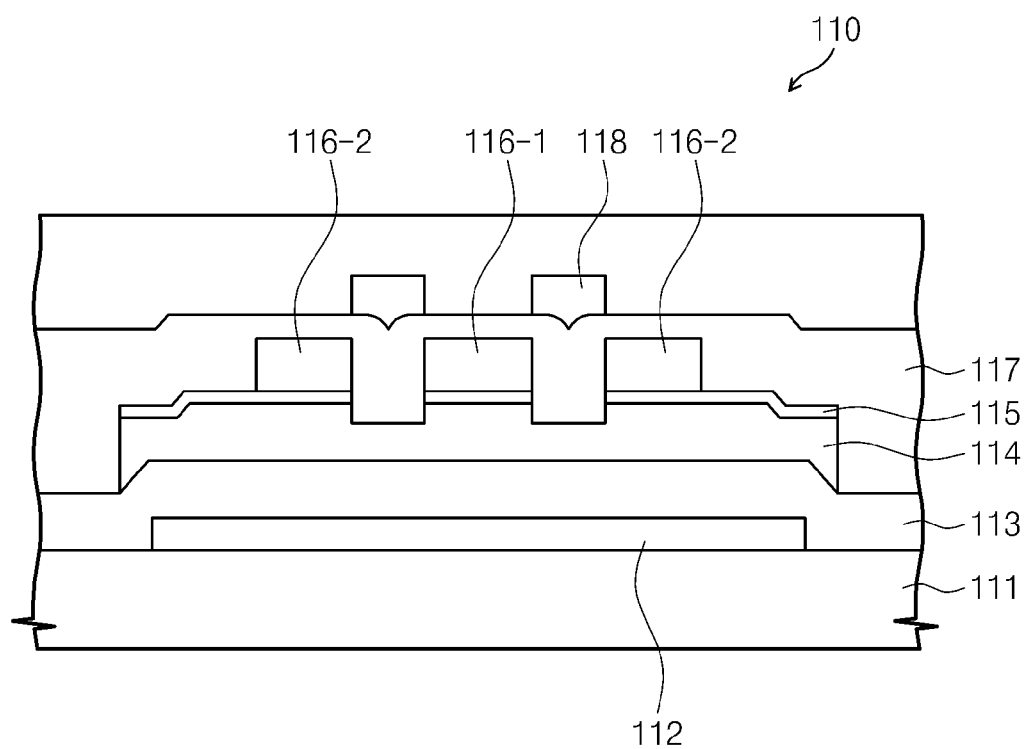
FIG. 9 is a partial cross-sectional view taken along line A-A' of FIG. 8.

FIG. 8 is a plan view of an exemplary embodiment of a buffer transistor according to the present invention, and FIG. 9 is a partial cross-sectional view taken along line A-A' of FIG. 8.

In FIGS. 8 and 9, the same reference characters denote the same or like elements as described in greater detail above, and thus any repetitive detailed description thereof will hereinafter be omitted or simplified.

As shown in FIGS. 8 and 9, a metal layer is deposited over an entire surface of a transparent substrate 111 and is patterned to form a gate electrode line 112 on a lower substrate 110. In FIGS. 8 and 9, a single layer of metal is used to form the gate electrode line 112, but it will be noted that additional exemplary embodiments are not limited thereto or thereby. Specifically, for example, a multi-layer of metal or metals may be used to form the gate electrode line 112. In an exemplary embodiment, for example, the gate electrode line 112 includes a conductive layer of metals such as aluminum (Al) or an aluminum alloy, copper (Cu) or a copper alloy, silver (Ag) or a silver alloy, and/or gold (Au) or a gold alloy. In addition, the gate electrode line 112 may further include another conductive layer of metals having sufficient physical, chemical and electrical contact properties with indium tin oxide ("ITO") or indium zinc oxide ("IZO"), such as chromium (Cr), titanium (Ti), tantalum (Ta), molybdenum (Mo), and an alloy of those metals like molybdenum-tungsten alloy (MoW), to have a multi-layered structure. As an example, the gate electrode line 112 may have a double-layered structure of a lower film and an upper film, such as aluminum/molybdenum, aluminum alloy/molybdenum, aluminum/titanium, titanium/copper, or molybdenum/copper, but additional exemplary embodiments are not limited thereto.

Then, an insulating material such as silicon oxide or silicon nitride is deposited over the entire surface of the transparent substrate 111 on which the gate electrode line 112 is formed, and an intrinsic semiconductor material and an impurity-doped semiconductor material are then formed thereon.

The insulating material, the intrinsic semiconductor material and the impurity-doped semiconductor material are etched to form a gate insulating layer 113, a semiconductor layer 114 and an impurity-doped semiconductor layer 115. As a result, the gate insulating layer 113 covers the entire surface of the gate electrode line 112, and the semiconductor layer 114 and the impurity-doped semiconductor layer 115 are formed on the gate insulating layer 113 to have substantially the same shape as the gate insulating layer 113.

A metal layer is deposited over the entire surface of the substrate on which the semiconductor layer 114 and the impurity-doped semiconductor layer 115 are formed. The metal layer is patterned to form a drain electrode line 116-1 and a source electrode line 116-2 on the gate electrode line 112. The drain electrode line 116-1 and the source electrode line 116-2 include a conductive layer of metals such as aluminum (Al) or an aluminum alloy, copper (Cu) or a copper alloy, silver (Ag) or a silver alloy, and/or gold (Au) or a gold alloy, for example. In addition, the drain electrode line 116-1 and the source electrode line 116-2 may further include another conductive layer of metals having good physical, chemical and electrical contact properties with ITO or IZO, such as chromium (Cr), titanium (Ti), tantalum (Ta), molybdenum (Mo) and any alloys or mixtures of the foregoing metals, such as molybdenum-tungsten alloy (MoW), for example, to have a multi-layered structure. The drain electrode line 116-1 and the source electrode line 116-2 may have a double-layered structure including a lower film and an upper film, such as aluminum/molybdenum, aluminum alloy/molybdenum, aluminum/titanium, titanium/copper or molybdenum/copper, although additional exemplary embodiments are not limited thereto.

An insulating material, such as silicon nitride or silicon oxide, for example, is deposited over the entire surface of the substrate on which the drain electrode line 116-1 and the source electrode line 116-2 are formed to form a protective layer 117.

A transparent conductive layer 118 that includes a material such as IZO or ITO, for example, and that serves as a pixel electrode, is deposited on the protective layer 117 and etched to form the pixel electrode and a buffer transistor T04 of a second stage ASG-2 and a third stage ASG-3. In an exemplary embodiment, IZO is used as the transparent conductive layer 118. The transparent conductive layer 118 is formed between the drain electrode line 116-1 and the source electrode line 116-2, so that a predetermined voltage, for example the off voltage VSS of about −7.5 volts (V), is applied to the semiconductor layer 114 and the impurity-doped semiconductor layer 115. In addition, the transparent conductive layer 118 may be formed to have a thickness from about 450 Angstroms (Å) to about 600 Å. As described in greater detail above, when the transparent conductive layer 118 is formed on the buffer transistor T04 of the second stage ASG-2 and the third stage ASG-3 as a top-gate to apply the predetermined voltage Vtg, the amount of leakage current through the buffer transistor T04 is decreased, thereby substantially improving the reliability defect, e.g., reducing the reliability defect in an exemplary embodiment.

Figure 10A:
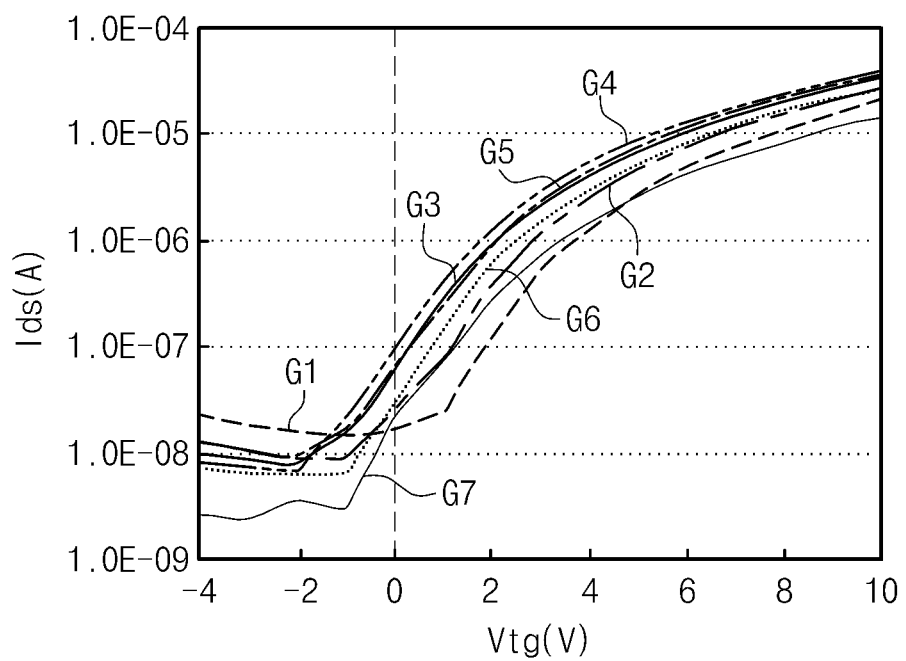
FIGS. 10A and 10B are graphs of current versus voltage showing a change in current of an exemplary embodiment of a buffer transistor according to a voltage applied to a top gate according to the present invention.
Figure 10B:
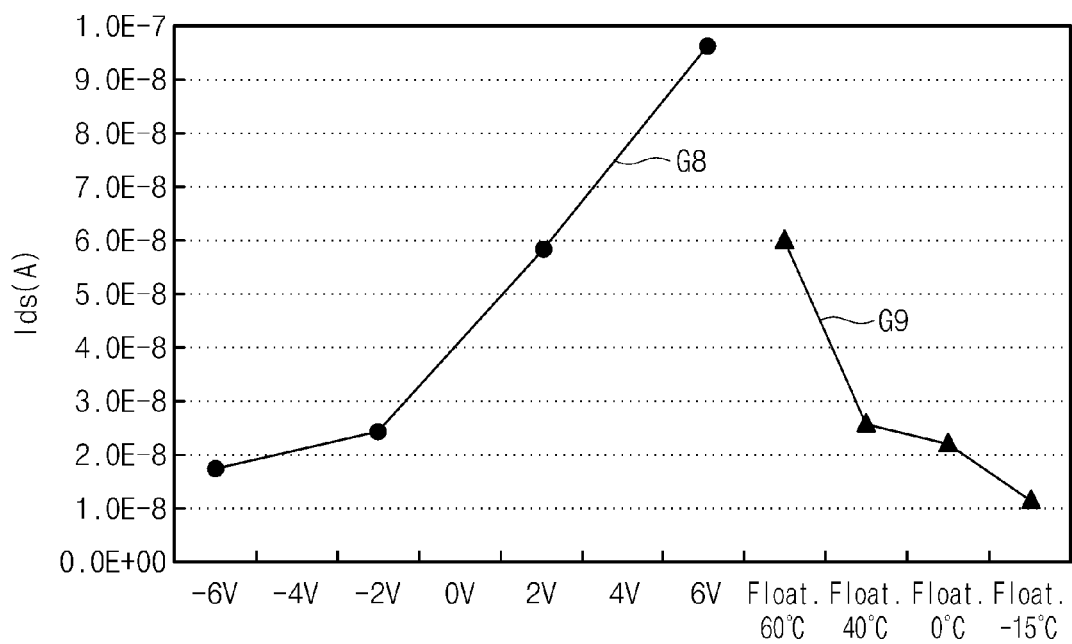

FIGS. 10A and 10B are graphs of current, in amperes (A), versus voltage, in volts (V) showing a change in current of an exemplary embodiment of a buffer transistor according to a voltage applied to the top gate thereof according to the present invention. In FIG. 10A, a first graph G1 represents a leakage current Ids when applying a top gate voltage Vtg of about −6V to the top-gate of the buffer transistor T04, a second graph G2 represents a leakage current Ids when applying a top gate voltage Vtg of about −2V to the top-gate of the buffer transistor T04, a third graph G3 represents a leakage current Ids in when applying a top gate voltage of about 2V to the top-gate of the buffer transistor T04, and a fourth graph G4 represents a leakage current Ids when applying a top gate voltage of about 6V to the top-gate of the buffer transistor T04. In addition, a fifth graph G5 represents a leakage current Ids when the top-gate is in a floating state at a temperature of about 60 degrees Celsius (° C.), a sixth graph G6 represents a leakage current Ids when the top-gate is in a floating state at a temperature of about 40° C., and a seventh graph G7 represents a leakage current Ids when the top-gate is in a floating state at a temperature of about 0° C. In FIG. 10B, an eight graph G8 represents a leakage current Ids according to a level of the top gate voltage Vtg applied to the top-gate of the buffer transistor T04, and a ninth graph G9 represents a leakage current Ids according to the temperature when the top-gate is in a floating state.

Referring to FIGS. 10A and 10B, when the buffer transistor T04 has a source-drain voltage Vds of about 35 V and is under a temperature of about 60° C., the leakage current Ids of the buffer transistor T04 decreases more when the top gate voltage Vtg applied to the transparent conductive layer 118 (hereinafter referred to as a "top-gate 118") is a negative ("−") voltage than when the top gate voltage Vtg applied to the top-gate 118 is a positive ("+") voltage. Also, when the buffer transistor T04 has a source-drain voltage of about 35 V and a gate-source voltage Vgs of about 0 V, and is under a temperature of about 60° C., the leakage current is decreases more when the top gate voltage Vtg of the negative ("−") voltage is applied to the top-gate 118 than when the transparent conductive layer 118 is in the floating state.

Figure 11:
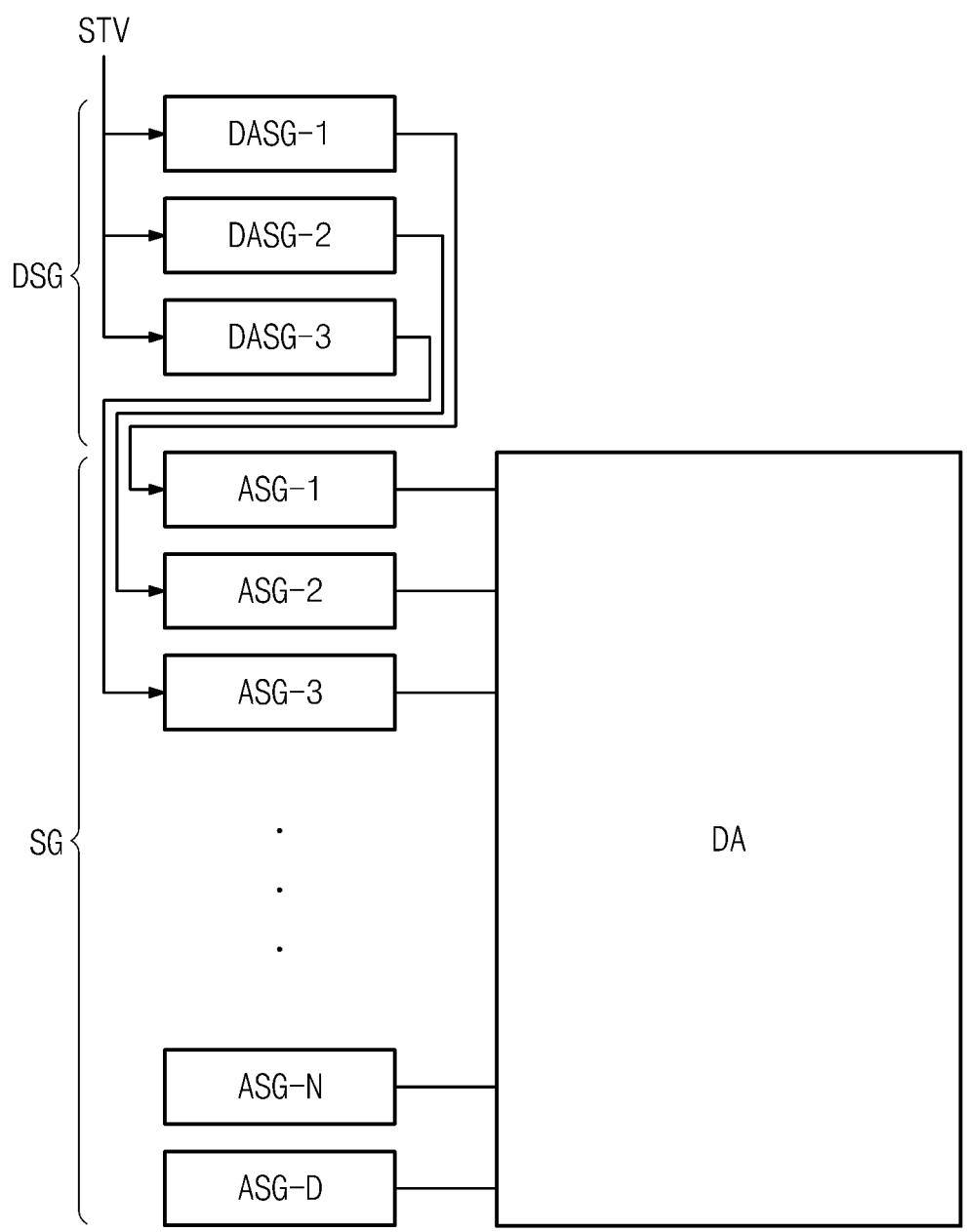
FIG. 11 is a block diagram showing another exemplary embodiment of a gate driving circuit according to the present invention.

FIG. 11 is a block diagram of another exemplary embodiment of a gate driving circuit according to the present invention. In FIG. 11, the same reference characters denote the same or like elements described in greater detail above, and thus any repetitive detailed description thereof will hereinafter be omitted or simplified.

Referring to FIG. 11, a gate driving circuit according to another exemplary embodiment includes a dummy stage group DSG having a first dummy stage DASG-1, a second dummy stage DASG-2, and a third dummy stage DASG-3, as well as a stage group SG having stages ASG-1-ASG-N and ASG-D.

The first through third dummy stages DASG-1-DASG-3 are disposed prior to the first through third stages ASG-1-ASG-3. The first through third dummy stages DASG-1-DASG-3 apply a carry voltage outputted from a carry transistor T15 of each stage to a first input terminal IN1 of the first through third stages ASG-1-ASG-3. The carry voltage applied to the first input terminal IN1 is provided to a Q-node QN of each stage through a buffer transistor T04.

When a start signal STV is applied to the first through third dummy stages DASG-1~DASG-3, each of the first through third dummy stages DASG-1~DASG-3 provide an output voltage to a corresponding stage during 3H period, and the first to third stages ASG-1~ASG-3 are operated in response to an output voltage of the first to third dummy stages DASG-1~DASG-3, respectively.

As described in greater detail above, since the first through third dummy stages DASG-1-DASG-3 are disposed prior to the first through third stages ASG-1-ASG-3, the reliability defect, caused by a leakage current of the Q-node QN of the first through third stages ASG-1-ASG-3 operated upon when directly receiving a conventional start signal STVP, is visible only in the first through third dummy stages DASG-1-DASG-3. Therefore, the reliability defect is not visible in the first through third stages ASG-1-ASG-3 in an exemplary embodiment, and thus the reliability defect is not visible in a display area DA of a display device according to an exemplary embodiment of the present invention. It will be noted that the number of dummy stages may be changed according to a driving condition in additional exemplary embodiments.

Thus, according to the exemplary embodiments described herein, a reliability defect in an LCD is substantially improved by adjusting a size of a buffer transistor included in a predetermined stage among a first stage group. Also, a transparent conductive layer is disposed on the buffer transistor to apply a voltage thereto, thereby further improving the reliability defect. In addition, the reliability defect may be even further improved by forming a dummy stage group that applies an output voltage to the first stage group.

While the present invention has been particularly shown and described with reference to exemplary embodiments thereof, it will be understood by those of ordinary skill in the art that various changes in form and details may be made therein without departing from the spirit or scope of the present invention as defined by the following claims.

What is claimed is:
1. A gate driving circuit comprising:
N stages, where N is a natural number greater than or equal to 3, the N stages are cascaded, and each of the N stages has a respective gate line connected and corresponding thereto;

a first stage group including k stages of the N stages, where k is a natural number less than N, and which outputs first output signals in response to a same start signal; and a second stage group including N-k stages, and which generates second output signals in response to the corresponding first output signals from the first stage group and outputs the second output signal to a corresponding gate line, wherein the first stage group comprises first buffers which receive the start signal and the second stage group comprises second buffers which receive the first output signals, and a size of the first buffer is smaller than a size of the second buffer, wherein respective first buffers are diode-connected to respective first terminals of the k stages which receive the same start signal, and respective second buffers are diode-connected to respective second terminals of the N-k stages which receive the first output signals.

2. The gate driving circuit of claim 1, wherein the first stage group comprises:
a first stage;
a second stage; and
a third stage, and
the second stage group comprises fourth through N-th stages.

3. The gate driving circuit of claim 2, wherein
the first buffer is included in the second stage or in the third stage, and
the second buffer is included in one of the fourth stage to the Nth stage of the second stage group.

4. The gate driving circuit of claim 2, wherein the size of the first buffer is smaller than the size of the second buffer by about 35 percent.

5. The gate driving circuit of claim 2, further comprising a dummy stage which applies a dummy output signal to the first stage group and the second stage group to lower the first output signal and the second output signal to a level of a gate-off voltage.

6. The gate driving circuit of claim 5, wherein the first stage group and the second stage group each comprises:
a voltage output part which applies a clock signal to the gate lines as a gate voltage in response to one of the start signal and an output signal outputted from a previous stage;
an output driving part which receives one of the start signal and the output signal outputted from the previous stage to drive the voltage output part;
a holding part which holds the gate lines at the gate-off voltage; and
a discharge part disposed at an end portion of the gate lines to discharge the gate lines to the gate-off voltage in response to the gate voltage outputted from the voltage output part.

7. The gate driving circuit of claim 6, wherein the voltage output part comprises:
a pull-up transistor comprising:
a control electrode which receives one of the start signal and the output signal from the previous stage;
an input electrode which receives the clock signal; and
an output electrode connected to the gate line; and
a pull-down transistor comprising:
a control electrode which receives the output signal from a next stage;
an input electrode connected to the output electrode of the pull-up transistor; and an output electrode connected to an input terminal which receives an off voltage.

8. The gate driving circuit of claim 7, wherein the first buffer and the second buffer each comprises a transistor comprising:
an input electrode and a control electrode which receive the output signal from the previous stage; and
an output electrode connected to the control electrode of the pull-up transistor.

9. The gate driving circuit of claim 6, wherein the clock signal comprises:
a first clock signal, a second clock signal and a third clock signal, each of which is repeatedly turned on and off at different time delay periods; and
a fourth clock signal, a fifth clock signal and a sixth clock signal, each of which is repeatedly turned on and off and has a different phase from each of the first clock signal, the second clock signal and the third clock signal, respectively.

10. The gate driving circuit of claim 9, wherein
the different time delay periods include 1 horizontal period, and
the phase difference is about 180 degrees.

11. A display apparatus comprising:
pixels arranged in a matrix;
gate lines which apply gate signals to the pixels;
data lines which apply data signals to the pixels;
a gate driver connected to the gate lines and which generates the gate signal based on at least one clock signal;
a data driver connected to the data lines and which generates the data signal; and
a controller which controls an operation of the gate driver and the data driver, wherein
the gate driver comprises:
a first stage group comprising a first stage, a second stage and a third stage, the first stage, the second and the third stage each of which receive a same start signal, and which respectively generate first gate signals and respectively applies the first gate signals to corresponding gate lines connected to the corresponding first stage, second and third stage, respectively; and
a second stage group which receives the first gate signals outputted from the first stage group, generates second gate signals and applies the first gate signals to corresponding gate lines, the second stage group comprises fourth through N-th stages, where N is a natural number,
the first stage group comprises first buffers which receive the start signal and the second stage group comprises second buffers which receive the first gate signals, and
a size of the first buffer is smaller than a size of the second buffer,
wherein respective first buffers are diode-connected to respective first terminals of the first, second and third stages which receive the same start signal, and
respective second buffers are diode-connected to respective second terminals of the fourth through N-stages which receive the first gate signals.

12. The display apparatus of claim 11, wherein the first buffer is included in the second stage and the third stage, respectively,
the second buffer is included in one of the fourth stage to the Nth stage of the second stage group, and
the size of the first buffer is smaller than the size of the second buffer by about 35 percent.

13. The display apparatus of claim 12, wherein the first stage group and the second stage group each comprises:

a voltage output part which applies a clock signal to the gate lines as a gate signal in response to one of the start signal and a signal outputted from a previous stage;

an output driving part which receives the one of the start signal and the signal outputted from the previous stage and drives the voltage output part;

a holding part which holds the gate lines at a gate-off voltage; and a discharge part disposed at an end portion of the gate lines to discharge the gate lines to the gate-off voltage in response to the gate voltage outputted from the voltage output part.

14. The display apparatus of claim 11, wherein the clock signal comprises:

a first clock signal, a second clock signal and a third clock signal, each of which is repeatedly turned on and off at different time delay periods; and a fourth clock signal, a fifth clock signal and a sixth clock signal, each of which is repeatedly turned on and off and has a different phase from each of the first clock signal, the second clock signal and the third clock signal, respectively, wherein the time delay period includes 1 horizontal period and the phase difference is about 180 degrees.

15. A display apparatus comprising:

a substrate;

a gate electrode disposed on the substrate and which receives one of a gate on voltage and a gate off voltage;

a first insulating layer disposed on the substrate and the gate electrode;

a semiconductor layer disposed on the first insulating layer to form a channel;

a source electrode disposed on the semiconductor layer and which receives an image voltage;

a drain electrode disposed on the semiconductor layer and which receives the image voltage from the source electrode upon the gate on voltage applied to the gate electrode;

a second insulating layer disposed on the drain electrode and the source electrode; and a transparent conductive layer disposed on the second insulating layer and disposed substantially only overlapping a portion of the second insulating layer that is between the drain electrode and the source electrode, and the transparent conductive layer receives the gate-off voltage.

16. The display apparatus of claim 15, wherein the gate-off voltage is a negative voltage.

17. The display apparatus of claim 16, wherein the negative voltage is about -7.5 volts.

18. A gate driving circuit in which N stages, where N is a natural number greater than or equal to 3, are cascaded and apply a gate signal to corresponding gate lines, the gate driving circuit comprising:

a first stage group including k stages, where k is a natural number less than N and more than one, which receive a same start signal; and a second stage group including N-k stages which receive output signals outputted from previous stages of the first stage group, wherein each of the N stages comprises a buffer transistor which receives one of the start signal and the output signals, and a buffer transistor of at least one stage of the first stage group has a driving capacity different from a driving capacity of a buffer transistor of the second stage group, wherein the first buffers are diode-connected to respective first terminals of the k stages which receive the same start signal, and the second buffers are diode-connected to respective second terminals of the N-k stages which receive the output signals.

19. The gate driving circuit of claim 18, wherein the buffer transistor of at least one stage of the first stage group has a channel width smaller than a channel width of the buffer transistor of the second stage group.

20. The gate driving circuit of claim 18, wherein the first stage group comprises a first stage, a second stage and a third stage, and the second stage group comprises fourth through N-th stages.

21. The gate driving circuit of claim 20, wherein buffer transistors of the second stage and the third stage have a width narrower than a width of the buffer transistors of the fourth through the N-th stages.

22. The gate driving circuit of claim 20, wherein a buffer transistor of the first stage has a width wider than a width of the buffer transistors of the second stage and the third stage.

23. A gate driving circuit in which N stages, where N is a natural number greater than or equal to 3, are cascaded and apply gate signals to corresponding gate lines, the gate driving circuit comprising:

a first stage group which includes k stages, where k is a natural number less than N and more than one, which each receive a same start signal; and a second stage group which includes N-k stages and receives output signals outputted from previous stages of the first stage group, wherein each of the N stages comprises a buffer transistor which receives one of the start signal and a carry signal through a gate electrode, and a buffer transistor of at least one stage of the first stage group has a structure different from a structure of a buffer transistor of at least one stage of the second stage group, wherein respective first buffers are diode-connected to respective first terminals of the k stages which receives the same start signal, and respective second buffers are diode-connected to respective second terminals of the N-k stages which receive the output signals.

24. The gate driving circuit of claim 23, wherein a buffer transistor of at least one stage of the first stage group has a channel width narrower than a channel width of a buffer transistor of at least one stage of the second stage group.

25. The gate driving circuit of claim 24, wherein the buffer transistor of at least one stage of the first stage group and the buffer transistor of at least one stage of the second stage group each comprises:

a gate electrode disposed on a substrate and which receives a gate on voltage and a gate off voltage;

a first insulating layer disposed on the substrate and the gate electrode;

a semiconductor layer disposed on the first insulating layer to form a channel;

a source electrode disposed on the semiconductor layer and which receives an image signal based on a signal applied to the gate electrode;

a drain electrode disposed on the semiconductor layer and which receives the image signal from the source electrode; and a second insulating layer disposed on the drain electrode and the source electrode, wherein the buffer transistor of at least one stage of the first stage group further comprises a conductive layer disposed on the second insulating layer between the drain electrode and the source electrode and which receives the gate-off voltage.

26. A display apparatus comprising:
a display part which displays an image based on gate signals and data signals;
a data driver which supplies the data signals to the display part;
a gate driver including cascaded stages which output the gate signals to the display part in response to at least one clock signal; and
a controller which controls an operation of the data driver and the gate driver, wherein
the gate driver comprises N stages, where N is a natural number greater than or equal to 3, the N stages being cascaded and configured to apply the gate signals to corresponding gate lines,
the N stages comprises:
a first stage group including k stages, where k is a natural number less than N, which each receive a same start signal; and
a second stage group including N-k stages which receive signals outputted from previous stages of the first stage group,
each stage of the N stages comprises a buffer transistor which receives one of the start signal and a carry signal, and
a buffer transistor of at least one stage of the first stage group has a channel width which is different from a channel width of a buffer transistor of the second stage group,
wherein respective first buffers are diode-connected to respective first terminals of the k stages which receive the same start signal, and
respective second buffers are diode-connected to respective second terminals of the N-k stages which receive the signals outputted from the previous stages of the first stage group.

27. The display apparatus of claim 26, wherein the buffer transistor of the at least one stage of the first stage group has a channel width that is narrower than a channel width of the buffer transistor of the second stage group.

28. The display apparatus of claim 27, wherein the first stage group comprises a first stage, a second stage and a third stage, and the second stage group comprises fourth through N-th stages.

29. The display apparatus of claim 28, wherein a buffer transistor of the second stage and the third stage has a channel width which is narrower than a channel width of the buffer transistor of the first stage and the fourth through N-th stages.

30. The display apparatus of claim 28, wherein the buffer transistor of the first stage has a channel width which is wider than the channel width of the buffer transistor of the second stage and the third stage.

* * * * *